(12) United States Patent
Agarwal et al.

(10) Patent No.: US 10,715,118 B2
(45) Date of Patent: Jul. 14, 2020

(54) FLIP-FLOP WITH SINGLE PRE-CHARGE NODE

(71) Applicant: Samsung Electronics Co., Ltd., Suwon-si, Gyeonggi-do (KR)

(72) Inventors: Shyam Agarwal, Bangalore (IN); Sandeep B V, Bangalore (IN); Shreyas Samraksh Jayaprakash, Karnataka (IN); Abhishek Kumar Ghosh, Bangalore (IN); Parvinder Kumar Rana, Bangalore (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/101,789

(22) Filed: Aug. 13, 2018

(65) Prior Publication Data

US 2019/0058461 A1    Feb. 21, 2019

(30) Foreign Application Priority Data

Aug. 17, 2017    (IN) .............................. 201741029152

(51) Int. Cl.
| | | |
|---|---|---|
| *G11C 11/41* | (2006.01) | |
| *H03K 3/3562* | (2006.01) | |
| *H01L 27/11* | (2006.01) | |
| *H03K 19/017* | (2006.01) | |
| *H03K 3/012* | (2006.01) | |

(52) U.S. Cl.
CPC .......... *H03K 3/35625* (2013.01); *G11C 11/41* (2013.01); *H01L 27/1104* (2013.01); *H03K 3/012* (2013.01); *H03K 19/01728* (2013.01)

(58) Field of Classification Search
None
See application file for complete search history.

(56) References Cited

U.S. PATENT DOCUMENTS

| | | | |
|---|---|---|---|
| 5,991,191 A * | 11/1999 | Rao ..................... | G11C 11/5621 365/154 |
| 2004/0140835 A1* | 7/2004 | Lehmann ............... | G11C 17/16 327/208 |
| 2012/0139601 A1* | 6/2012 | Kim ....................... | H03K 3/356 327/212 |

(Continued)

OTHER PUBLICATIONS

J. Montanaro et al., "A 160 MHz 32-b 0.5-W CMOS RISC microprocessor," IEEE J. Solid-Atate Circuits, vol. 31, No. 11, pp. 1703?1714, Nov. 1996.

(Continued)

*Primary Examiner* — Douglas King
(74) *Attorney, Agent, or Firm* — Harness, Dickey & Pierce, P.L.C.

(57) ABSTRACT

Various example embodiments herein disclose a flip-flop including a master latch comprising one of: a plurality of P-type metal-oxide-semiconductor (PMOS) and a plurality of N-type metal-oxide-semiconductor (NMOS). A slave latch includes one of: a plurality of PMOS and a plurality of NMOS. An inverted clock signal input is communicatively connected with the master latch and the slave latch. The master latch includes a single pre-charge node. The single pre-charge node sets up a data capture path in the flip flop. Data is stored in the master latch and the slave latch via the pre-charge node.

20 Claims, 7 Drawing Sheets

(56) References Cited

U.S. PATENT DOCUMENTS

2015/0207494 A1\* 7/2015 Kim ................ H03K 3/356139
                                                            327/218
2017/0230038 A1\* 8/2017 Shin ...................... H03K 5/135
2018/0123571 A1\* 5/2018 Savanth ............. H03K 3/35625

OTHER PUBLICATIONS

B. Nikolic, V. G. Oklobdzija, V. Stajanovic, W. Jia, J. K. Chiu, and M. M. Leung, "Improved sense-amplifier based flip-flop: Design and measurements," IEEE J. Solid-State Circuits, vol. 35, No. 6, pp. 876?883, Jun. 2000.

\* cited by examiner

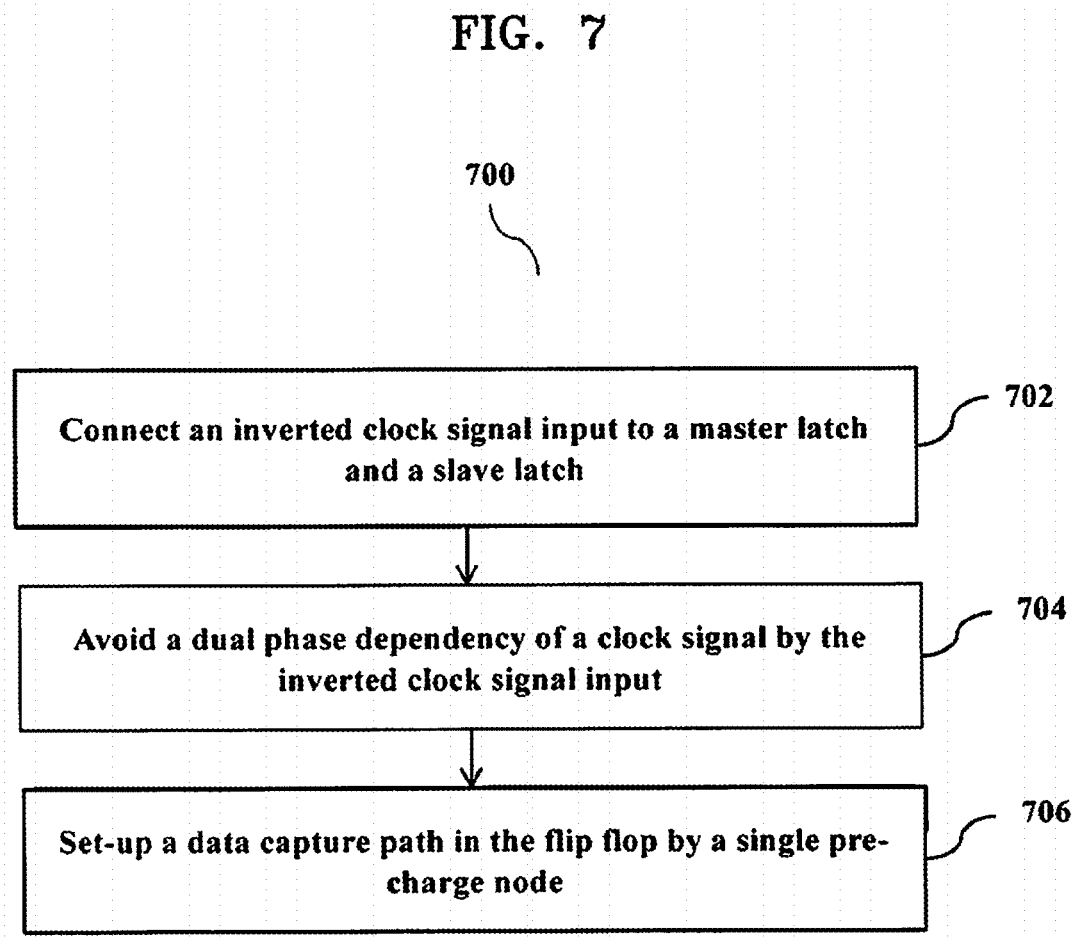

FLIP-FLOP WITH SINGLE PRE-CHARGE NODE

CROSS-REFERENCE TO RELATED APPLICATION

A claim for the benefit of priority under 35 U.S.C. § 119 is made to Indian Patent Application No. 201741029152 filed on Aug. 17, 2017, in the Office of the Controller General of Patents, Designs & Trade Marks (CGPDTM), the entire contents of which are hereby incorporated by reference.

FIELD

Various example embodiments relate to a sequential logic circuit, a system, non-transitory computer readable medium, and/or a method thereof, and more particularly to a D-flip-flop circuit having a low power and/or low voltage operability.

BACKGROUND

A flip-flop is a fundamental element used in the design of a digital electronic circuit. The flip-flop is an integral component of the digital circuits used for data storage (e.g., data storage devices, memory chips, etc.). In general, a "D" flip-flop has an input signal D and an output signal Q. The output signal stores a previous value of the input signal until the D flip-flop is triggered by a clock signal at which point the output signal Q takes on the current value of the input signal D.

Further, sequential cells (i.e., flip-flop) typically occupies approximately 60% of the physical area of the total standard cells area in a typical System-On-A-Chip (SoC) layout. Further, the sequential cells with the clock network contributes close to 50% of the total power consumed in the typical SoC. Further, any small cell level change in the sequential cells directly impacts the area and/or power consumed of the SoC in a bigger way.

In conventional circuits, the circuit has more semiconductor devices so that the leakage and the clock power is also more than circuits using D flip-flops. Further, the power consumption is high in a Sense-Amplifier based conventional circuit as the conventional circuit includes two pre-charging nodes and a high pre-charge load and/or clock path load. Further, the conventional circuits based on transmission gates and/or tri-state gates gated by clocks are not robust as because the operation of this type of conventional circuit is dependent on both clock phases. Further, this type of conventional circuits contains a clock buffer at the clock inputs which cause additional power dissipation at each and every clock transition.

Conventional circuits, designed using Fin Field-Effect Transistor (FINFET) has higher parasitic/pin capacitance compared to a planar transistor which results in relatively higher dynamic power numbers, as well as lesser speed. While leakage is under control in the FinFET, a dynamic power consumption accounts for a significant portion of total power consumption of the circuit using the FinFET.

Many conventional designs are proposed for improving the operation and function of the flip-flop but they include disadvantages in terms of current leakage, increased power consumption, lack of robustness, less reliability, integrity issues, increased operation dependency, increased time, increased cost, increased complexity, increased design time, increase in number of hardware components used, increase in physical size of the circuit, and so on.

Thus, it is desired to address the above mentioned disadvantages or other shortcomings and/or provide a useful alternative.

SUMMARY

Various example embodiments herein provides a D flip-flop circuit.

At least one example embodiment herein provides a D flip-flop circuit that is operated using a single pre-charge node.

At least one example embodiment herein provides a D flip-flop circuit that is operated based on a data dependent discharge node.

At least one example embodiment herein provides a D flip-flop circuit that reduces a clock power consumption.

At least one example embodiment herein provides a D flip-flop circuit, where a circuit operation of the D flip-flop circuit is controlled using a single clock phase.

At least one example embodiment herein provides a single-clock phase operation of a D flip-flop circuit that assists in reducing the size of a CLK inverter.

At least one example embodiment herein provides a single-clock phase operation of a D flip-flop circuit that assists in reducing a CLK pin input capacitance.

At least one example embodiment herein provides a single-clock phase operation of a D flip-flop circuit that reduces in a SoC level clock network latency and/or power consumption.

Various example embodiments herein disclose a flip-flop device. The flip-flop device includes: a master latch comprising at least one of a first plurality of P-type metal-oxide-semiconductor (PMOS) transistors and a first plurality of N-type metal-oxide-semiconductor (NMOS) transistors, a slave latch comprising at least one of a second plurality of PMOS transistors and a second plurality of NMOS transistors, and an inverted clock signal input wherein the inverted clock signal input is connected to the master latch and the slave latch, and the master latch comprises a single pre-charge node.

In at least one example embodiment, the inverted clock signal input is used to synchronize the master latch and the slave latch to avoid a dual phase dependency of a clock signal.

In at least one example embodiment, the flip-flop device is operated based on a data dependent discharge node.

In at least one example embodiment, the single pre-charge node sets a data capture path between the master latch and the slave latch, wherein data input to the master latch is stored in the master latch and the slave latch through the single pre-charge node using the data capture path.

In at least one example embodiment, the inverted clock signal input is connected to the master latch and the slave latch to operate the flip-flop at variable voltage levels, and the variable voltage levels correspond to at least one of a low voltage supply level, a near-threshold voltage range level, a sub-threshold voltage level, and a normal voltage level.

In at least one example embodiment, the flip-flop device is a positive edge triggered D-flip-flop device.

In at least one example embodiment, the flip-flop device is a negative edge triggered D-flip-flop device Various example embodiments herein achieve a method for managing operation of a flip-flop device. The method includes connecting an inverted clock signal input to a master latch and a slave latch. The master latch includes at least one of a first plurality of P-type metal-oxide-semiconductor (PMOS) transistors and a first plurality of N-type metal-oxide-semiconductor (NMOS) transistors. A slave latch comprises at least one of a second plurality of PMOS transistors and a second plurality of NMOS transistors. The master latch comprises a single pre-charge node.

Various example embodiments herein disclose a flip-flop device. The flip-flop device includes: a master latch comprising at least one of a first plurality of P-type metal-oxide-semiconductor (PMOS) transistors and a first plurality of N-type metal-oxide-semiconductor (NMOS) transistors, a slave latch comprising at least one of a second plurality of PMOS transistors and a second plurality of NMOS transistors, and an clock signal input wherein the clock signal input is connected to the master latch and the slave latch, and the master latch comprises a single pre-charge node which is pre-charged to logic level high at every low level of a clock signal.

These and other aspects of the example embodiments herein will be better appreciated and understood when considered in conjunction with the following description and the accompanying drawings. It should be understood, however, that the following descriptions, while discussing various example embodiments and numerous specific details thereof, are given by way of illustration and not of limitation. Many changes and modifications may be made within the scope of the example embodiments herein without departing from the spirit thereof, and the example embodiments herein include all such modifications.

BRIEF DESCRIPTION OF FIGURES

Various example embodiments are illustrated in the accompanying drawings, throughout which like reference letters indicate corresponding parts in the various figures. The example embodiments herein will be better understood from the following description with reference to the drawings, in which:

FIG. 7 is a flow diagram illustrating a method for managing operation of the flip-flop, according to at least one example embodiment.

DETAILED DESCRIPTION

Figure 1:
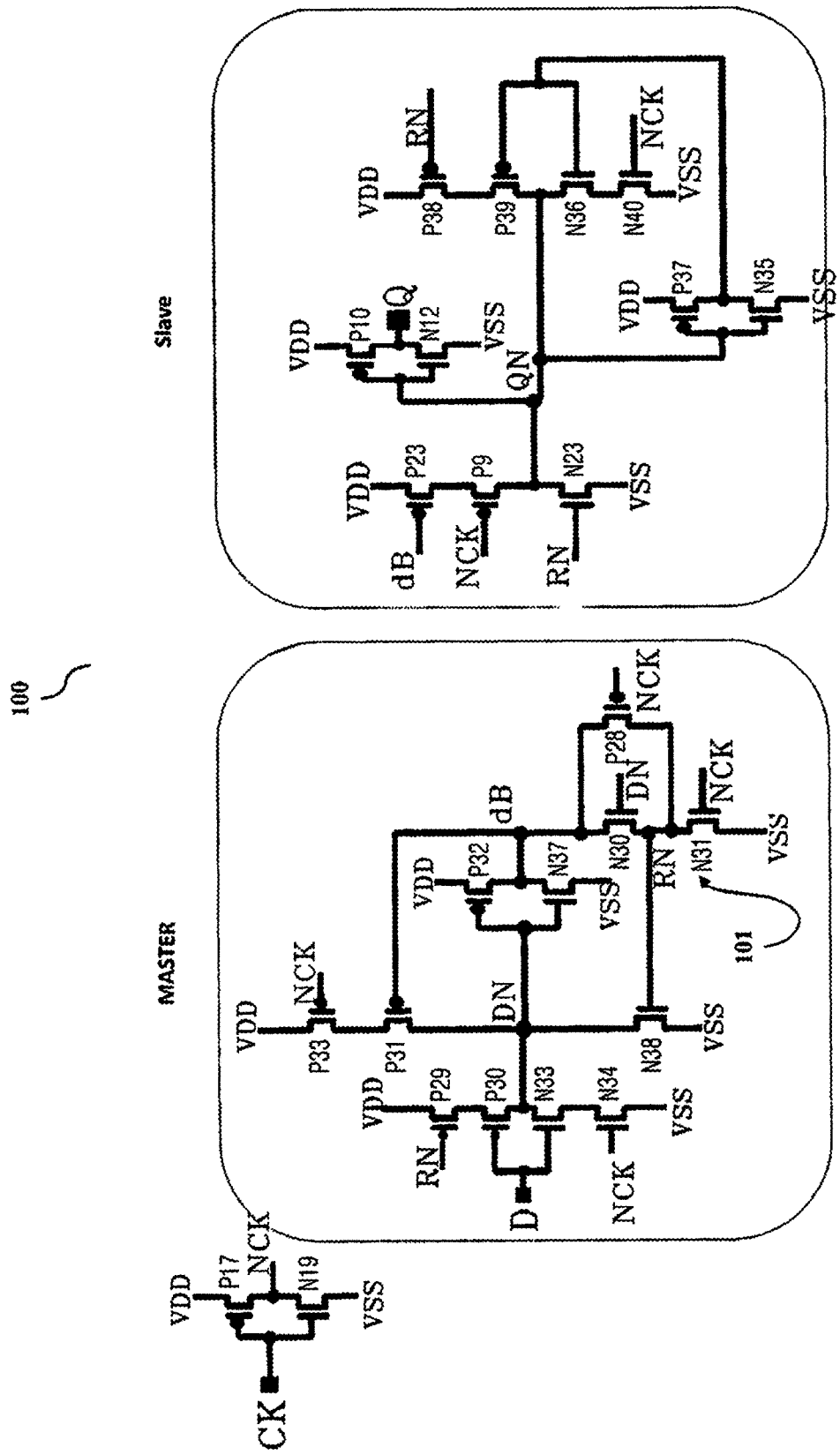
FIG. 1 shows a circuit diagram of a D-Flip-Flop, according to at least one example embodiment.

Various example embodiments herein, and the various features and advantageous details thereof, are explained more fully with reference to the non-limiting example embodiments that are illustrated in the accompanying drawings and detailed in the following description. Descriptions of well-known components and processing techniques are omitted so as to not unnecessarily obscure the example embodiments herein. Also, the various example embodiments described herein are not mutually exclusive, as some example embodiments can be combined with one or more other example embodiments to form new example embodiments. The term "or" as used herein, refers to a non-exclusive or, unless otherwise indicated. The examples used herein are intended merely to facilitate an understanding of ways in which the example embodiments herein can be practiced and to further enable those skilled in the art to practice the example embodiments herein. Accordingly, the examples should not be construed as limiting the scope of the example embodiments herein.

As is traditional in the field, various example embodiments may be described and illustrated in terms of blocks which carry out a described function or functions. These blocks, which may be referred to herein as units or modules or the like, are physically implemented by analog and/or digital circuits, such as logic gates, integrated circuits, microprocessors, microcontrollers, memory circuits, passive electronic components, active electronic components, optical components, hardwired circuits, or the like, and may optionally be driven by firmware and/or software executed by hardware, such as controllers, processors, etc. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the example embodiments may be physically separated into two or more interacting and discrete blocks without departing from the scope of the inventive concepts. Likewise, the blocks of the example embodiments may be physically combined into more complex blocks without departing from the scope of the inventive concepts The accompanying drawings are used to help easily understand various technical features and it should be understood that the example embodiments presented herein are not limited by the accompanying drawings. As such, the inventive concepts should be construed to extend to any alterations, equivalents and substitutes in addition to those which are particularly set out in the accompanying drawings. Although the terms first, second, etc. may be used herein to describe various elements, these elements should not be limited by these terms. These terms are generally only used to distinguish one element from another.

Further, a "Complementary logic," which refers to logic circuitry involving both P-channel and N-channel transistors, is often more commonly referred to as P-type Metal Oxide Semiconductor (PMOS) and an N-type Metal Oxide Semiconductor (NMOS).

The terms second level and first level, high and low, and 1 and 0, as used in the following description may be used to describe various logic states as known in the art. Particular voltage values of the second and first levels are defined arbitrarily with regard to individual circuits. Furthermore, the voltage values of the second and first levels may be defined differently for individual signals such as a clock and a digital data signal. Although specific circuitry has been set forth, it will be appreciated by those skilled in the art that not all of the disclosed circuitry is required to practice the inventive concepts. Moreover, certain well known circuits have not been described, to maintain focus on the inventive concepts. Similarly, although the description refers to logical "0" and logical "1" or low and high in certain locations, one skilled in the art appreciates that the logical values can be switched, with the remainder of the circuit adjusted accordingly, without affecting operation of the present inventive concepts.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. A procedure, logic block, process, or the like, of the example embodiments is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

Various example embodiments herein provide a flip-flop includes a master latch comprising at least one of: a plurality of P-type metal-oxide-semiconductor (PMOS) and a plurality of N-type metal-oxide-semiconductor (NMOS). A slave latch includes at least one of: a plurality of PMOS and a plurality of NMOS. An inverted clock signal input is communicatively connected with the master latch and the slave latch. The master latch includes a single pre-charge node. The single pre-charge node sets up a data capture path in the flip flop. Data is stored in the master latch and the slave latch via the pre-charge node.

Unlike the conventional circuits, the D flip-flop circuit of at least one example embodiment is operated using the single pre-charge node. Further, according to at least one example embodiment, the single pre-charge node does not discharge at every clock cycle. Further, according to at least one example embodiment, the D flip-flop circuit is operated based on a data dependent discharge node. This results in reducing a clock power consumption by the D flip flop circuit.

Further, according to at least one example embodiment, a circuit operation of the D flip-flop circuit is controlled using a single clock phase, so as to result in better robustness and/or lower the Vmin. Further, according to at least one example embodiment, the single-clock phase operation assists in reducing the size of the CLK inverter and/or assists in reducing CLK pin input capacitance. This results in reducing the SoC level clock network latency and/or power consumption.

Further, according to at least one example embodiment, the clock signal passes through one inventor and six gates, so as to improve the operation efficiency of the D flip flop.

Unlike conventional circuits and designs, the static D-flip-flop of at least one example embodiment operates at a low power while maintaining and/or improving the operational speed of the D flip-flop in comparison to conventional D flip-flops. Additionally, according to at least one example embodiment, the static D-flip-flop is smaller in size in comparison to conventional D flip-flops.

According to at least one example embodiment, the D-flip-flop reduces the clock power by approximately 24% with an added speed advantage (e.g., an increase of speed) of approximately 2%, a lesser area (e.g., a decrease in the total physical area occupied) by approximately 5.88%, and a lesser (and/or decreased) clock pin capacitance by approximately 28%. Further, according to at least one example embodiment, the D-flip-flop is more robust and has been tested through 5000 monte-carlo iterations for 6-sigma global variations around NN, FS and SF corners. These tests simulate the extreme process variation conditions where the D-flip-flop according to at least one example embodiment is found to be robust against data retention, data contention, write-back, and/or internal-hold failure problems.

According to at least one example embodiment, the D-flip-flop has a functional robustness against process variation and improves the performance up to 2%. According to at least one example embodiment, the D-flip-flop is designed such the clock load is reduced by approximately 28%. The layout of the D-flip-flop of at least one example embodiment uses less M2 and no usage of cross coupled poly patterns. This results in a reduction of manufacturing costs for the D flip-flop of at least one example embodiment.

The D-flip-flop of the example embodiments may be implemented in a wireless communication device, a TV, an embedded system, an application processor, and/or in any other digital SoC or Integrated Circuit (IC) applications.

Referring now to the drawings, and more particularly to FIGS. 1 through 7, similar reference characters denote corresponding features consistently throughout the figures.

FIG. 1 shows a circuit diagram of a D-Flip-Flop 100, according to at least one example embodiment. The D-Flip-Flop 100 can be a Positive Edge Triggered D-Flip-Flop, but is not limited thereto, and may be a negative edge triggered D-Flip-Flop, etc. The D-Flip-Flop 100 is provided with P-channel logic and its complementary N-channel logic. The positive edge triggered D-flip-flop 100 includes a master latch and a slave latch. An inverted version of a clock signal which is represented as a NCK signal (e.g., a "not" clock signal) has been derived through an inverter circuit using a P-transistor P17 and an N-transistor N19. This NCK signal is used in the master latch as well as in the slave latch in order to avoid a dual phase dependency of the clock signal. In other words, the NCK signal is used as a clock signal to the master latch and the slave latch, thereby allowing for a single phase clock signal to be used to synchronize the D-Flip-Flop. This boosts up and/or increases the positive edge triggered D-flip-flop functional robustness and enables the positive edge triggered D-flip-flop 100 to be operated at low supply voltages, including supply voltages as low as near-threshold voltages (and/or a near-threshold voltage range) and/or sub-threshold voltages (and/or a sub-threshold voltage range), etc.

Further, the master latch includes a single pre-charge node RN 101 which is placed between a source/drain of a plurality of transistors, such as an N-transistor N31, an N-transistor N30, and a P-transistor P28, etc., and is connected at a gate of N-transistor N38. When the clock signal CK is low, the pre-charge node 101 is held low using the N-transistor N31 which is gated by the NCK. The input data signal D is allowed to travel from D to DN and DN to dB only during a low clock signal level according to some example embodiments, but is not limited thereto. This defines a setup path and/or a data capture path of the positive edge triggered D-flip-flop 100. In other words, the data is captured in the master latch but is not transferred to the slave latch. As soon as the positive edge of the clock signal CK arrives, the NCK signal goes low, which causes the pre-charge N-transistor N31 to be turned off and a P-transistor P9 in the slave latch to be turned on. This results in the slave latch input gates opening and the data captured at dB is allowed to travel to output Q through an intermediate signal QN. Additionally, the input gate of the master latch is closed through a combination of the P-transistor P29 and the N-transistor N34, which decreases and/or prevents any unwanted data path signal change to be reflected in the circuit while the clock signal level is high. A feedback loop is established in the master latch between DN and dB in order to retain the data captured. A feedback loop of the slave latch is stopped in order to enable the smooth data writing of the slave path to output Q.

FIGS. 2 to 5 illustrate the operations of the D-flip-flop 100, according to some example embodiment.

Figure 2:
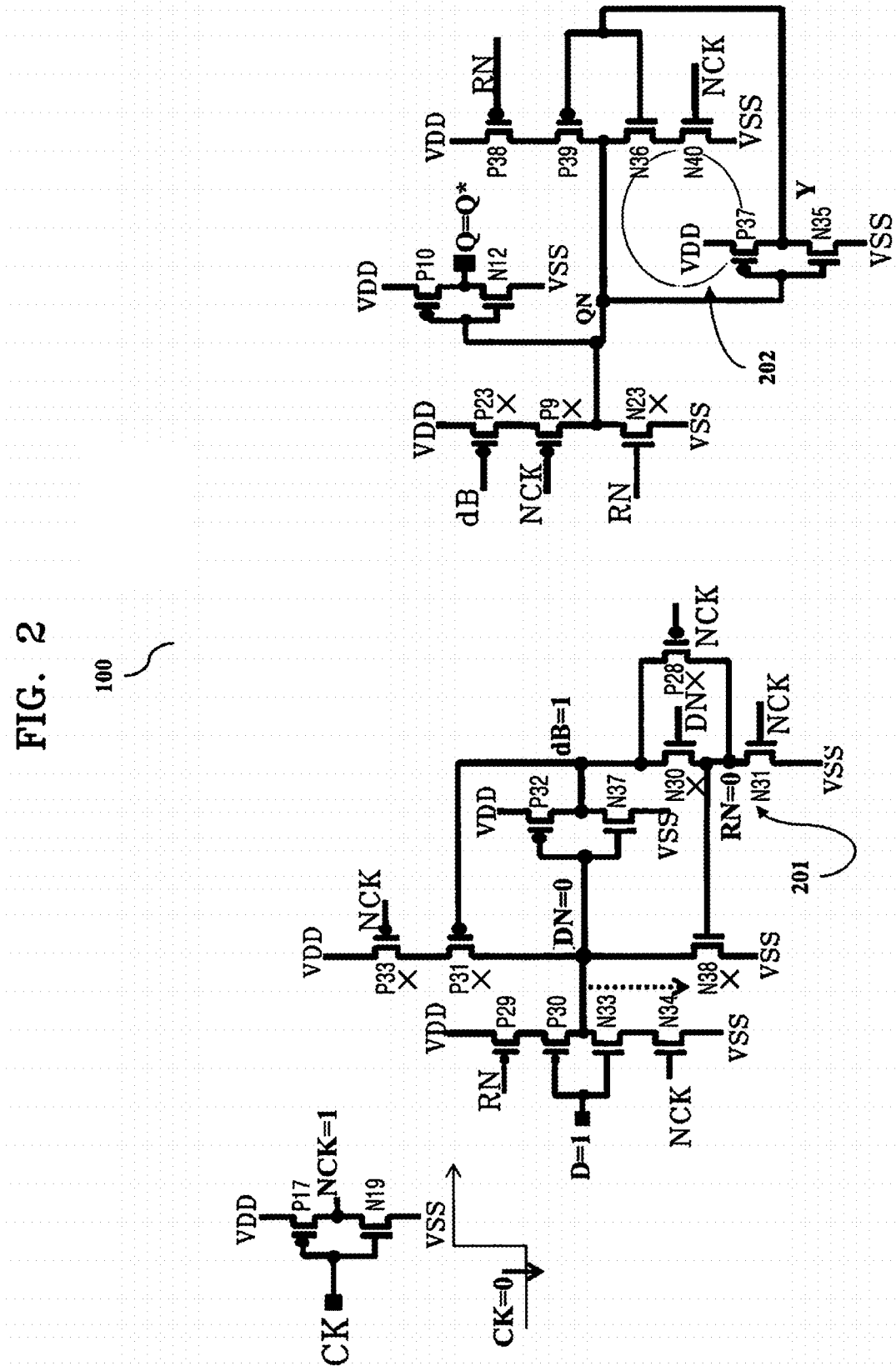
FIGS. 2 to 5 illustrate operations of the D-flip-flop, according to some example embodiments.

Referring to FIG. 2, the circuit operation of the D-Flip-Flop 100 is explained when clock signal CK=0 and D=1, or in other words, operation of the circuit of the D-Flip-Flop

100 before the positive edge of the clock signal goes high (e.g., operations occurring when CK=0 and before CK=1).

Further, the positive edge of the clock refers to a time and/or a moment at which the clock signal CK transitions from 0 to 1. The negative edge of the clock refers to a time and/or moment at which CK transitions from 1 to 0.

When the clock signal CK is low, a data signal travels through DN and dB, thereby causing DN to go low and dB to go high. Since the DN is low, the DN gated N-transistor N30 is in the off state, and because of the clock signal CK being low and the NCK signal, which is an inverted signal of the clock signal, is high, the P-transistor P28 is also in an off state. This results in the cutting of (e.g., the blocking of) both of the RN pre-charge node paths 201, and accordingly the RN signal stays at low with the help of N-transistor N31. So that the data D=1 is captured, the D signal is allowed to change its state while the clock signal CK is low. Additionally, the RN signal being low causes the N-transistor N38 to be in the off state (e.g., the N-transistor is off), and the dB signal being high causes the P-transistor P31 to be off, so that there is no active input path to the DN input other than the D input to the DN node, and thus only the input D effects the DN state. Additionally, the RN signal being low causes N-transistor N23 to be off and the NCK signal being high causes the P-transistor P9 to be off, and thus both of the input gates to the slave latch are also off. This reduces and/or prevents any data transfer into the slave latch. Moreover, the slave latch feedback loop 202 is turned on (e.g., high) with because the N-transistor N40 and the P-transistor P38 are both on, thus causing retention (and/or storage) of the previous state data at the output Q.

Figure 3:
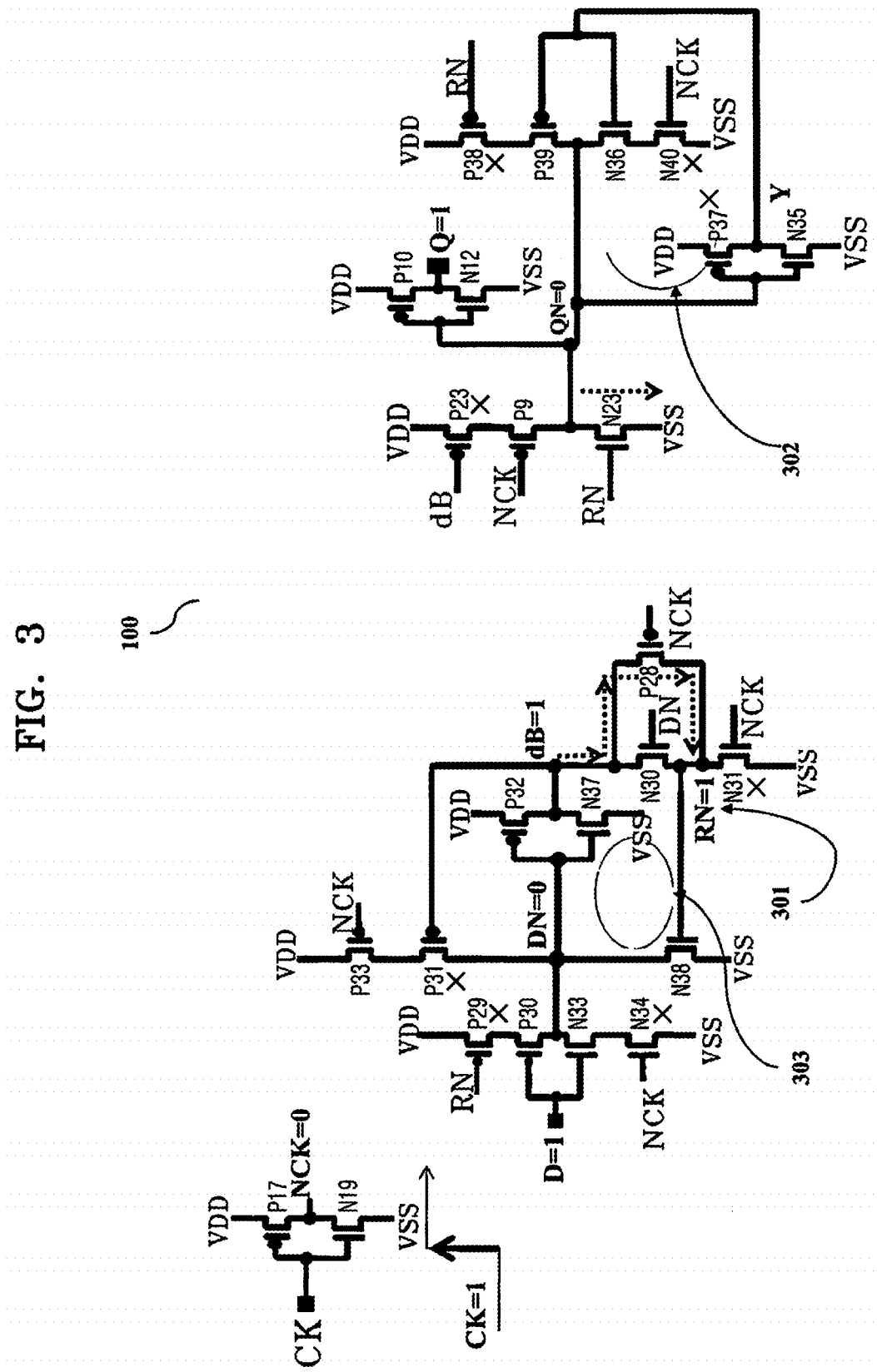

Referring to the FIG. 3, the circuit operation of the D-Flip-Flop 100 is explained when CK=1 and D=1. As soon as the clock signal CK becomes high, the NCK signal goes low, which turns on the P-transistor P28. This transition opens up the pre-charge node 301 charging path through dB node and the P-transistor P28. Accordingly, the RN node 301 charges up and becomes high, which turns on the N-transistor N38, and thus a feedback loop 303 is established in the master latch to hold the DN state and the dB state while the clock signal CK level is high (e.g., 1). Additionally, the RN signal being high cuts off (e.g., blocks) the P-transistor P29, and the NCK signal being low cuts off (e.g., blocks) the N-transistor N34. With the two transistors P29 and N34 cut off, the input path for D signal is also cut off, which reduces and/or prevents any data path change to be reflected in the master latch.

At the slave latch side, the RN signal being held high causes node QN to be discharged through the N-transistor N23, and subsequently the output signal Q rises to high through the P-transistor P10. The slave latch feedback loop 302 is now broken as the N-transistor N40 is turned off because of the NCK signal being low, and the P-transistor P38 is also turned off because the RN signal is high.

Figure 4:
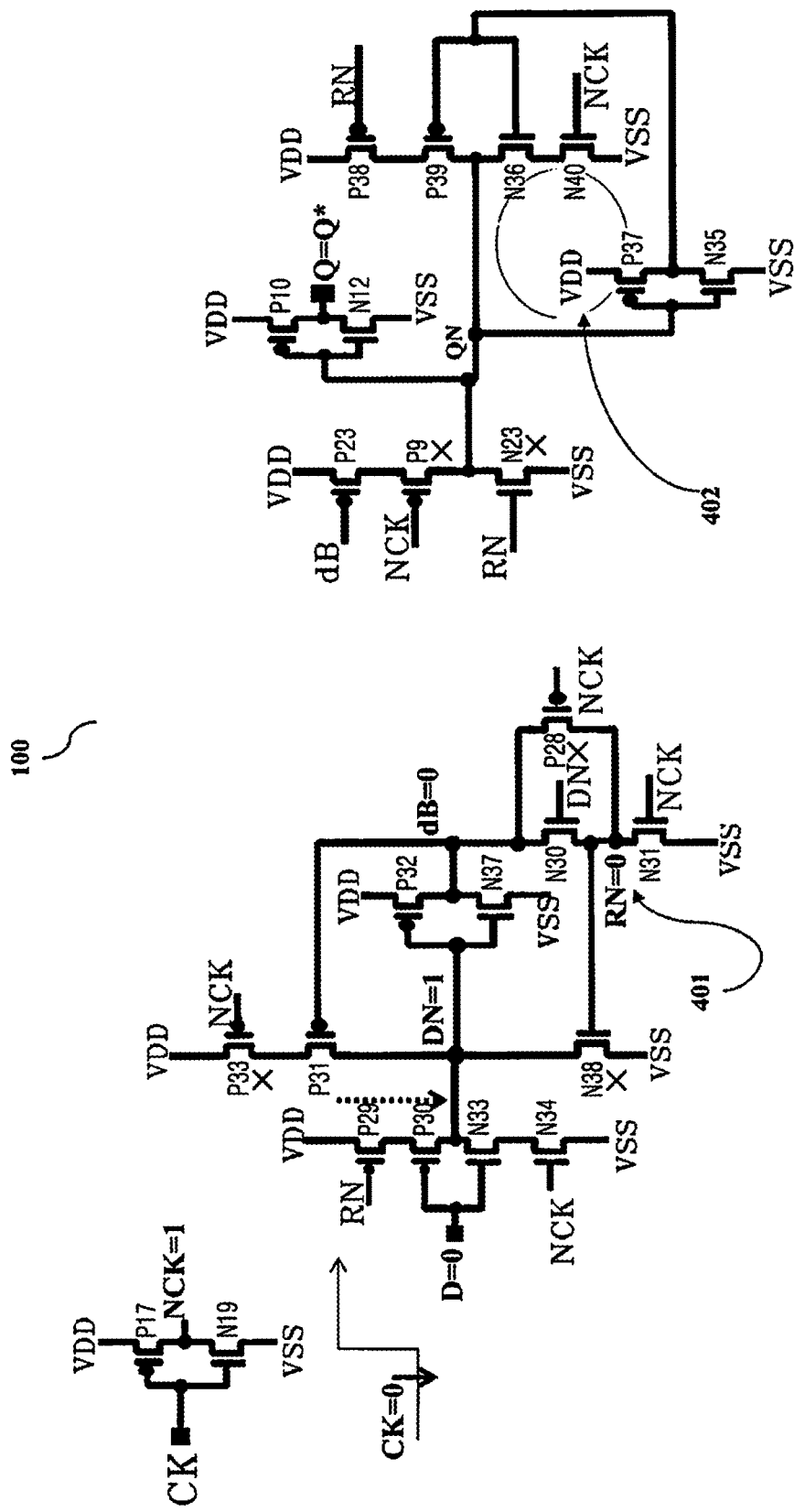

Referring to the FIG. 4, the circuit operation of the D-Flip-Flop 100 is explained when CK=0 and D=0. The data signal travels through the DN node and the dB node, and the dB node stays at the low but does not get further access into the slave latch because the P-transistor P9 and the N-transistor N23, which are acting as the input gates to the slave latch, are in an off state. However, with the RN signal being low and the NCK signal being high, the slave latch feedback 402 is established, which helps in retaining the earlier state data at QN and Q.

Figure 5:
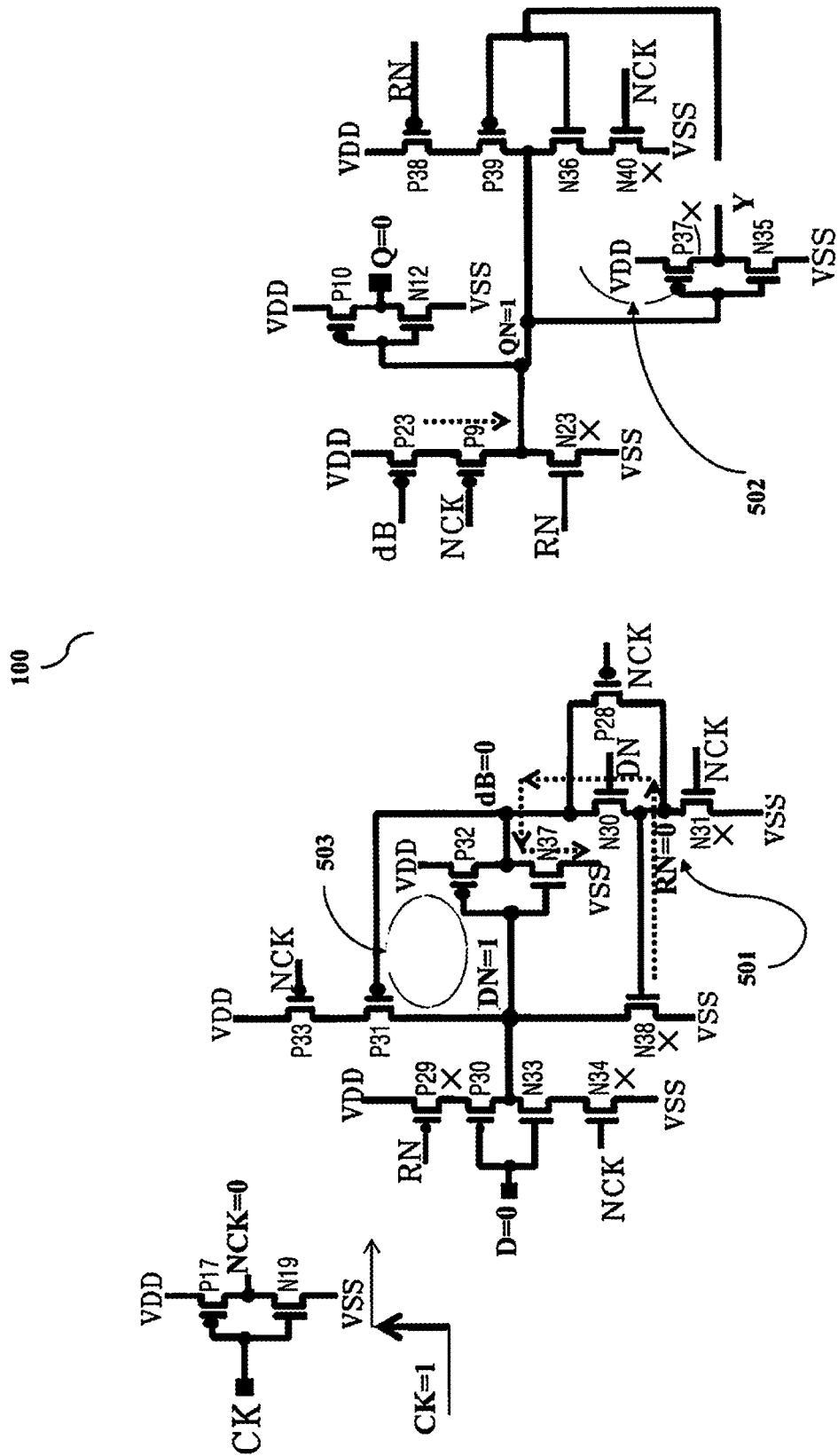

Referring to the FIG. 5, the circuit operation of the D-Flip-Flop 100 is explained when CK=1 and the D=0. The data signal has already traveled through the DN node and the dB node, and dB is Low. With the clock signal CK going high, the NCK signal goes to low, which opens up the P-transistor P28 and establishes a path for the RN signal to ground through the P-transistor P28, the N-transistor N30 and the N-transistor N37. Additionally, the P-transistor P33 is turned on, which establishes a feedback loop 503 in the master latch, and helps maintain (e.g., store) the data at the DN node and the dB node.

Further, the slave latch feedback loop 1002 has broken because of the NCK signal being low. The P-transistor P9 opens up the slave latch writing path and the node QN charges up to high with the help of the P-transistors P23 and P9. This subsequently causes the Q node to go low, thus transferring the data signal low to output Q at the positive edge of the clock signal.

Figure 6:
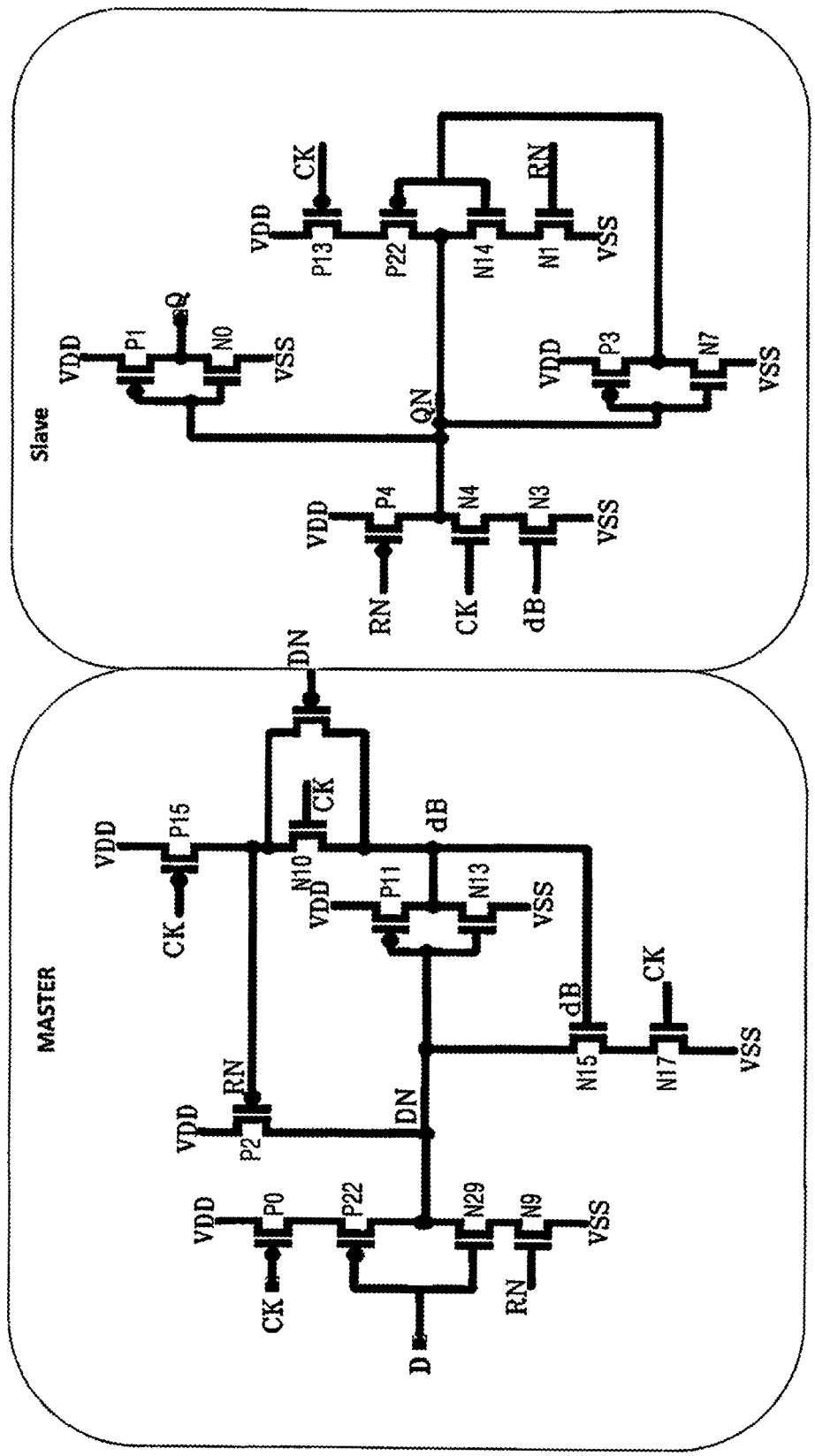
FIG. 6 is another circuit diagram of the D-Flip-Flop, according to at least one example embodiment.

FIG. 6 is another circuit diagram of the D-Flip-Flop 600, according to at least one example embodiment. The D-Flip-Flop 600 is designed so that the input clock signal inverter (e.g., the NCK signal) is removed and the clock signal CK is directly used on the gates. The D-Flip-Flop 600 includes the master latch and the slave latch. The input signal D is connected to the P-transistor P22 and N-transistor N29, and the input signal D travels through the DN node to the dB node when the clock signal CK is low. Further access to dB is stopped until the positive edge of the clock signal CK is received (e.g., until the clock signal transitions from low to high). The master latch includes two separate feedback loops, each feedback loop for a different logic level of the input signal D, and one feedback loop is activated at the positive edge of the clock. The feedback loops maintain data (e.g., store data) between the DN node and the dB node when the inputs of the master latch are closed when the clock signal CK is high. The input to the master latch is closed when the clock signal CK is high and the P-transistor P0, whose gate is connected to clock signal CK, and the N-transistor N9, whose gate is connected to RN, are turned off. There is a single-pre-charge node RN among the P-transistors P15, P14 and an N-transistor N10. At every clock low cycle, the pre-charge node is charged to logic level high. At the positive edge of the clock signal CK, when the data signal D logic level is D=high, the DN node will be low and the dB node will be high. Additionally, when the DN logic state is high, the P-transistor P14 will be turned on, which helps maintain (e.g., store) the logic state of RN at high through the P-transistors P11 and P14 after the closing of the P-transistor P15, following the positive edge of the clock. The lower feedback loop will be established with the help of N-transistors N15 and N17, which will help maintain the DN logic level at low, thus forming a feedback loop from DN-to-dB.

If D=low at the time of the positive edge of the clock signal CK, DN will be high and dB will be low. The high state of the DN node will cause the P-transistor P14 to be off. As soon as the clock signal arrives, the RN node will get discharged through the N-transistors N10 and N13, which will turn on the P-transistor P2, and cause a feedback loop to be established that maintains the logic states of DN and dB.

Data writing at the slave latches occurs based on the P-transistor P4 and the N-transistors N4 and N3. At the time of data writing, the slave feedback loop gets broken due to the P-transistor P13 and the N-transistor N1, and the feedback loop is established again at the falling edge of the clock signal CK using the same transistors.

The output Q is received at the output of an inverter circuit built using the P-transistor P1 and the N-transistor N0.

FIG. 7 is a flow diagram 700 illustrating a method for managing operation of the flip-flop 100 or 600, according to at least one example embodiment. At 702, the method includes connecting the inverted clock signal input to the master latch and the slave latch. At 704, the method includes avoiding the dual phase dependency of the clock signal by using an inverted input clock signal. At 706, the method includes setting up the data capture path in the flip flop 100 or 600 using a single pre-charge node. The data is stored in the master latch and the slave latch through the single pre-charge node.

The various actions, acts, blocks, steps, or the like in the method 700 may be performed in the order presented, in a different order and/or simultaneously. Further, in some example embodiments, some of the actions, acts, blocks, steps, or the like may be omitted, added, modified, skipped, or the like without departing from the scope of the inventive concepts.

The example embodiments disclosed herein can be implemented through at least one software program (e.g., computer readable instructions) executing on at least one hardware device (e.g., controllers, processors, or the like) and performing network management functions to control the elements. The elements shown in the FIGS. 1 to 7 include blocks, elements, actions, acts, steps, or the like which can be at least one of a hardware device, or a combination of a hardware device and software module.

The foregoing description of the specific example embodiments will so fully reveal the general nature of the example embodiments herein that others can, by applying current knowledge, readily modify and or adapt for various applications such specific example embodiments without departing from the generic concept, and, therefore, such adaptations and modifications should and are intended to be comprehended within the meaning and range of equivalents of the disclosed example embodiments. It is to be understood that the phraseology or terminology employed herein is for the purpose of description and not of limitation. Therefore, while the example embodiments herein have been described in terms of various example embodiments, those skilled in the art will recognize that the example embodiments herein can be practiced with modification within the spirit and scope of the example embodiments as described herein.

We claim:

1. A flip-flop device, comprising:
a master latch comprising at least one of a first plurality of P-type metal-oxide-semiconductor (PMOS) transistors and a first plurality of N-type metal-oxide-semiconductor (NMOS) transistors;
a slave latch comprising at least one of a second plurality of PMOS transistors and a second plurality of NMOS transistors; and
the master latch and the slave latch each configured to receive an inverted clock signal input; and
wherein the master latch is connected to the slave latch through a single pre-charge node and a data capture node,
the master latch is configured to,
discharge the single pre-charge node before a falling edge of the inverted clock signal, and
transfer a data input to the data capture node before the falling edge of the inverted clock signal, and
the slave latch further comprises a NMOS transistor connected to the single pre-charge node and a PMOS transistor connected to the data capture node.

2. The flip-flop device of claim 1, wherein the master latch and the slave latch are configured to synchronize based on the inverted clock signal input to avoid a dual phase dependency of a clock signal.

3. The flip-flop device of claim 1, wherein the flip-flop device is configured to operate based on a data dependent discharge node.

4. The flip-flop device of claim 1, wherein
the single pre-charge node is arranged to set a data capture path between the master latch and the slave latch; and
the master latch is configured to store the data input to the master latch in the master latch and the slave latch through the single pre-charge node using the data capture path.

5. The flip-flop device of claim 1, wherein the flip-flop device is configured to operate using a single clock phase of the inverted clock signal.

6. The flip-flop device of claim 1, wherein
the master latch and the slave latch are each configured to operate the flip-flop at variable voltage levels based on the inverted clock signal; and
the variable voltage levels correspond to at least one of a low voltage supply level, a near-threshold voltage range level, a sub-threshold voltage level, and a normal voltage level.

7. The flip-flop device of claim 1, wherein the flip-flop device is a positive edge triggered D-flip-flop device.

8. The flip-flop device of claim 1, wherein the flip-flop device is a negative edge triggered D-flip-flop device.

9. A method for managing operation of a flip-flop device, the method comprising:
connecting an inverted clock signal input to a master latch and a slave latch,
the master latch comprising at least one of a first plurality of P-type metal-oxide-semiconductor (PMOS) transistors and a first plurality of N-type metal-oxide-semiconductor (NMOS) transistors, and
the slave latch comprising at least one of a second plurality of PMOS transistors and a second plurality of NMOS transistors; and
wherein the master latch is connected to the slave latch through a single pre-charge node and a data capture node, and
the master latch is configured to,
discharge the single pre-charge node before a falling edge of the inverted clock signal, and
transfer a data input to the data capture node at the falling edge of the inverted clock signal, and
the slave latch further comprises a NMOS transistor connected to the single pre-charge node and a PMOS transistor connected to the data capture node.

10. The method of claim 9, the method further comprising:
synchronizing the master latch and the slave latch using the inverted clock signal input to avoid a dual phase dependency of a clock signal.

11. The method of claim 9, the method further comprising:
setting a data capture path between the master latch and the slave latch, wherein the data input to the master latch is stored in the master latch and the slave latch through the single pre-charge node using the data capture path.

12. The method of claim 9, the method further comprising:
controlling operation of the flip-flop device using a single clock phase.

13. The method of claim 9, the method further comprising:
   operating the flip-flop device based on a data dependent discharge node.

14. The method of claim 9, the method further comprising:
   operating the flip-flop device at variable voltage levels based on the inverted clock signal input,
      the inverted clock signal input being connected to the master latch and the slave latch, and the variable voltage levels correspond to at least one of a low voltage supply level, a near-threshold voltage range level, a sub-threshold voltage level, and a normal voltage level.

15. The method of claim 9, wherein the flip-flop device is a positive edge triggered D-flip-flop device.

16. The method of claim 9, wherein the flip-flop device is a negative edge triggered D-flip-flop device.

17. A flip-flop device, comprising:
   a master latch comprising at least one of a first plurality of P-type metal-oxide-semiconductor (PMOS) transistors and a first plurality of N-type metal-oxide-semiconductor (NMOS) transistors;
   a slave latch comprising at least one of a second plurality of PMOS transistors and a second plurality of NMOS transistors; and
   the master latch and the slave latch each configured to receive a clock signal; and wherein
   the master latch is connected to the slave latch through a single pre-charge node and a data capture node, and
   the master latch is configured to,
      charge the single pre-charge node to logic level high at every low level of the clock signal,
      transfer a data input to data capture node at every low level of the clock signal, and
   the slave latch further comprises a PMOS transistor connected to the single pre-charge node and a NMOS transistor connected to the data capture node.

18. The flip-flop device of claim 17, wherein the master latch and the slave latch are configured to synchronize with each other based on the clock signal to avoid a dual phase dependency of the clock signal.

19. The flip-flop device of claim 17, wherein the flip-flop device is configured to be operated based on a data dependent discharge node.

20. The flip-flop device of claim 17, wherein
   the single pre-charge node is arranged to set a data capture path between the master latch and the slave latch; and
   the master latch and the slave latch are configured to store the data input through the single pre-charge node using the data capture path.

* * * * *